United States Patent
Hashiguchi et al.

(10) Patent No.: US 11,117,795 B2
(45) Date of Patent: Sep. 14, 2021

(54) MEMS VIBRATION ELEMENT, METHOD OF MANUFACTURING MEMS VIBRATION ELEMENT, AND VIBRATION-DRIVEN ENERGY HARVESTER

(71) Applicants: National University Corporation Shizuoka University, Shizuoka (JP); Saginomiya Seisakusho, Inc., Tokyo (JP)

(72) Inventors: Gen Hashiguchi, Hamamatsu (JP); Hideaki Koga, Sayama (JP)

(73) Assignees: National University Corporation Shizuoka University, Shizuoka (JP); Saginomiya Seisakusho, Inc., Tokyo (JP)

(*) Notice: Subject to any disclaimer, the term of this patent is extended or adjusted under 35 U.S.C. 154(b) by 0 days.

(21) Appl. No.: 16/636,770

(22) PCT Filed: Aug. 8, 2018

(86) PCT No.: PCT/JP2018/029843
§ 371 (c)(1),
(2) Date: Feb. 5, 2020

(87) PCT Pub. No.: WO2019/031566
PCT Pub. Date: Feb. 14, 2019

(65) Prior Publication Data
US 2020/0377361 A1    Dec. 3, 2020

(30) Foreign Application Priority Data
Aug. 9, 2017  (JP) .............. JP2017-154475

(51) Int. Cl.
*B81B 3/00* (2006.01)
*B81B 7/02* (2006.01)
*H04R 19/01* (2006.01)

(52) U.S. Cl.
CPC .............. *B81B 3/0078* (2013.01); *B81B 7/02* (2013.01); *H04R 19/016* (2013.01)

(58) Field of Classification Search
CPC ................................ B81B 3/0078; B81B 7/02
See application file for complete search history.

(56) References Cited

U.S. PATENT DOCUMENTS 6,240,780 B1 * 6/2001 Negoro .............. G01C 19/5719
                                              73/504.12
2008/0079333 A1    4/2008 Ulm et al.
(Continued)

FOREIGN PATENT DOCUMENTS

JP    2005-224933 A    8/2005
JP    2006-5731 A    1/2006
(Continued)

OTHER PUBLICATIONS

International Search Report (PCT/ISA/210) issued in PCT Application No. PCT/JP2018/029843 dated Nov. 13, 2018 with English translation (four pages).
(Continued)

*Primary Examiner* — Thomas L Dickey
(74) *Attorney, Agent, or Firm* — Crowell & Moring LLP

(57) ABSTRACT

A MEMS vibration element includes: a base unit; a fixed unit fixed to the base unit; a movable unit that is movable relative to the fixed unit; and an elastic support unit that elastically supports the movable unit at the base unit. The elastic support unit is made of a material different from a material of the fixed unit and the movable unit.

12 Claims, 5 Drawing Sheets

(56) References Cited

U.S. PATENT DOCUMENTS

| | | |
|---|---|---|
| 2009/0184781 A1 | 7/2009 | Ni |
| 2010/0242604 A1 | 9/2010 | Sammoura et al. |
| 2013/0076202 A1 | 3/2013 | Naito et al. |
| 2014/0065751 A1 | 3/2014 | Suzuki et al. |
| 2017/0318394 A1 | 11/2017 | Hashiguchi et al. |
| 2019/0058420 A1 | 2/2019 | Toshiyoshi et al. |

FOREIGN PATENT DOCUMENTS

| | | |
|---|---|---|
| JP | 2009-171394 A | 7/2009 |
| JP | 2013-172523 A | 9/2013 |
| JP | 2014-49557 A | 3/2014 |
| JP | 2016-82836 A | 5/2016 |
| JP | 5961868 B2 | 8/2016 |
| JP | 2017-70163 A | 4/2017 |
| WO | WO 2011/147430 A1 | 12/2011 |
| WO | WO 2012/145279 A2 | 10/2012 |

OTHER PUBLICATIONS

Japanese-language Written Opinion (PCT/ISA/237) issued in PCT Application No. PCT/JP2018/029843 dated Nov. 13, 2018 (four pages).

Extended European Search Report issued in European Application No. 18844789.0 dated Mar. 19, 2021 (10 pages).

\* cited by examiner

MEMS VIBRATION ELEMENT, METHOD OF MANUFACTURING MEMS VIBRATION ELEMENT, AND VIBRATION-DRIVEN ENERGY HARVESTER

TECHNICAL FIELD

The present invention relates to a MEMS vibration element, a method of manufacturing a MEMS vibration element, and a vibration-driven energy harvester.

BACKGROUND ART

As one of energy harvesting technologies for harvesting energy from environmental vibrations, an approach of generating electric power from environmental vibrations using a vibration-driven energy harvester, which is a MEMS (Micro Electro Mechanical Systems) vibration element, is known (for example, PTL1). An environmental vibration includes a variety of frequency bands. In order to effectively perform vibration-driven energy harvesting, it is necessary to match a resonance frequency of the vibration-driven energy harvester with a predominant frequency which is a predominant frequency in a power spectrum of the environmental vibration.

CITATION LIST

Patent Literature

PTL1: Japanese Laid-Open Patent Publication No. 2013-172523

SUMMARY OF INVENTION

Technical Problem

The predominant frequency varies depending on an environment in which vibration is to be detected. However, in conventional vibration-driven energy harvesters, an elastic support unit of a MEMS vibration element constituting the vibration-driven energy harvester is made of the same material as that of a movable unit including a movable electrode. Therefore, the elastic support unit has a low flexibility in design and cannot easily adapt a variety of predominant frequencies, so that a lot of cost and effort are required for adaptation.

Solution to Problem

A MEMS vibration element according to the 1st aspect of the present invention comprises: a base unit; a fixed unit fixed to the base unit; a movable unit that is movable relative to the fixed unit; and an elastic support unit that elastically supports the movable unit at the base unit, wherein the elastic support unit is made of a material different from a material of the fixed unit and the movable unit. The MEMS vibration element according to the 2nd aspect of the present invention is in the MEMS vibration element according to the 1st aspect, wherein it is preferred that the elastic support unit is made of a material having a fracture toughness value higher than a fracture toughness value of the material constituting the fixed unit and the movable unit. The MEMS vibration element according to the 3rd aspect of the present invention is in the MEMS vibration element according to the 1st or 2nd aspect, wherein it is preferred that the elastic support unit is made of metal.

The MEMS vibration element according to the 4th aspect of the present invention is in the MEMS vibration element according to any one of the 1st through 3rd aspect, wherein it is preferred that the elastic support unit is made of a material having a fracture toughness value of 10 [MPa·m$^{1/2}$] or higher.

The MEMS vibration element according to the 5th aspect of the present invention is in the MEMS vibration element according to any one of the 1st through 4th aspect, wherein it is preferred that the fixed unit and the movable unit are made of silicon.

The MEMS vibration element according to the 6th aspect of the present invention is in the MEMS vibration element according to any one of the 1st through 5th aspect, wherein it is preferred that the fixed unit and the movable unit constitute a comb structure.

The MEMS vibration element according to the 7th aspect of the present invention is in the MEMS vibration element according to any one of the 1st through 6th aspect, wherein it is preferred that the elastic support unit is made of a flat plate, and a width in a direction orthogonal to a predetermined direction connecting the movable unit and the base unit at least partially varies depending on a position in the predetermined direction.

A method of manufacturing a MEMS vibration element according to the 8th aspect of the present invention comprises: forming a base unit; forming a fixed unit; forming a moving unit; forming an elastic support unit of a material different from a material of the fixed unit and the movable unit; connecting one end of the elastic support unit to the base unit; and connecting the other end of the elastic support unit to the movable unit.

The method of manufacturing a MEMS vibration element according to the 9th aspect of the present invention is in the method of manufacturing a MEMS vibration element according to the 8th aspect, wherein it is preferred that the elastic support unit is made of a material having a fracture toughness value higher than a fracture toughness of the material of the fixed unit and the movable unit.

The method of manufacturing a MEMS vibration element according to the 10th aspect of the present invention is in the method of manufacturing a MEMS vibration element according to the 8th or 9th aspect, wherein it is preferred that the fixed unit and the movable unit are formed by photolithography.

The method of manufacturing a MEMS vibration element according to the 11th aspect of the present invention is in the method of manufacturing a MEMS vibration element according to the 10th aspect, wherein it is preferred that, in the photolithography, the fixed unit, the movable unit, and a coupling portion for coupling the fixed unit and the movable unit are made of a same base material, and after one end of the elastic support unit is connected to the base unit and the other end of the elastic support unit is connected to the movable unit, the coupling portion is removed to separate the fixed unit and the movable unit.

A vibration-driven energy harvester according to the 12th aspect of the present invention comprises the MEMS vibration element according to any one of the 1st through 7th aspect, wherein the fixed unit comprises a fixed electrode; the movable unit comprises a movable electrode; at least one of the fixed electrode and the movable electrode has an electret on a surface thereof.

Advantageous Effects of Invention

According to the present invention, it is possible to easily manufacture a MEMS vibration element that adapts a variety of environmental vibrations.

BRIEF DESCRIPTION OF DRAWINGS

FIG. 1A is a top view, and FIGS. 1B and 1C are cross-sectional views.

FIG. 2A shows a step of connecting a fixed unit to a base unit, FIG. 2B shows a step of connecting an elastic support unit to a movable unit, and FIG. 2C shows a step of connecting the elastic support unit to the base unit.

FIG. 3A is a top view, FIGS. 3B to 3D are side cross-sectional views.

DESCRIPTION OF EMBODIMENTS

Hereinafter, embodiments of the present invention will be described with reference to the drawings. FIG. 1 shows an example of a MEMS vibration element according to an embodiment of the present invention. FIG. 1 is a view showing a schematic configuration in a case where the MEMS vibration element is applied to a vibration-driven energy harvester 100.

Figure 1A:
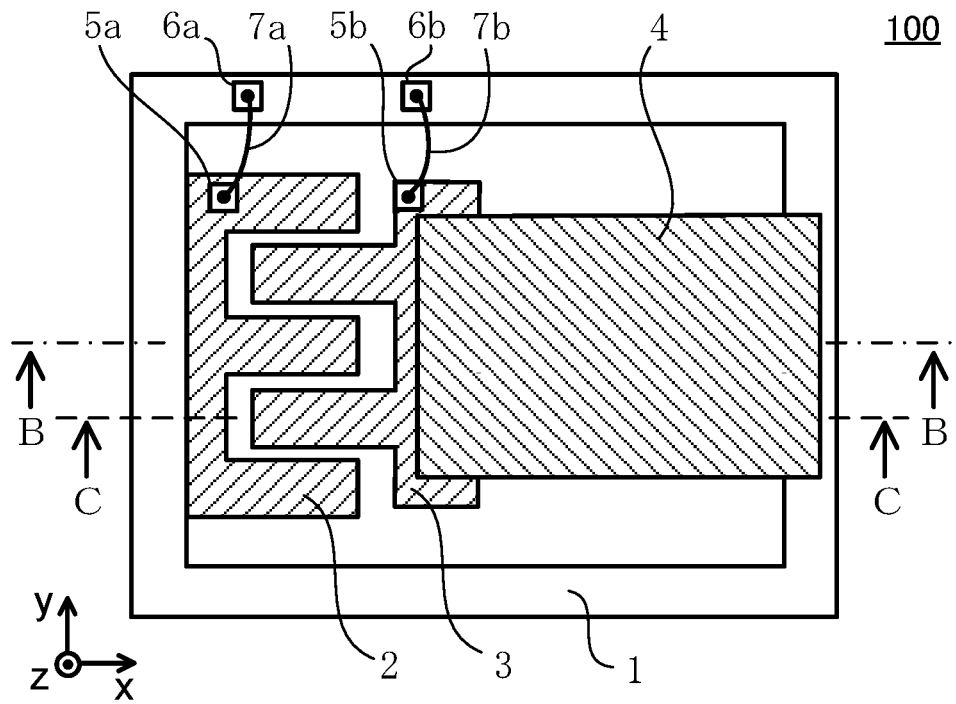
FIGS. 1A to 1C are schematic views showing a schematic configuration of a vibration-driven energy harvester.
Figure 1B:
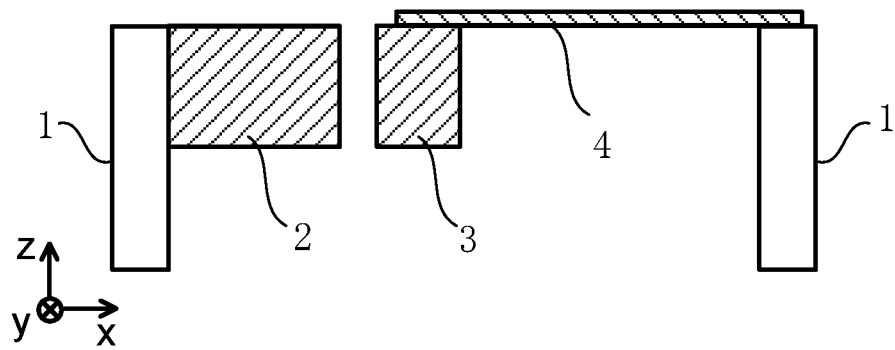
Figure 1C:
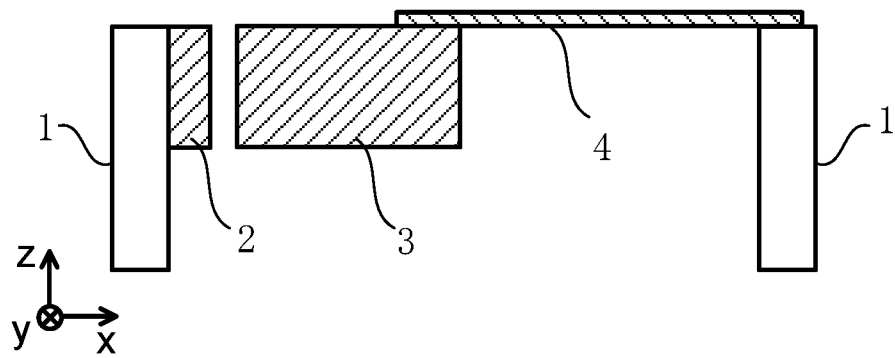

FIG. 1(a) is a top view of the vibration-driven energy harvester 100, FIG. 1(b) is a cross-sectional view taken along line B-B in FIG. 1(a), and FIG. 1(c) is a cross-sectional view taken along line C-C in FIG. 1(a).

The vibration-driven energy harvester 100 includes a fixed comb electrode 2 provided on one end side of a base unit 1 which is a rectangular frame, and a movable comb electrode 3 which is elastically supported by an elastic support unit 4 at the other end of the base unit 1 and meshes with the fixed comb electrode 2. The vibration-driven energy harvester 100 is a power generation element that uses, as electric power, electric charges generated between the movable comb electrode 3 and the fixed comb electrode 2. The electric charges result from displacement of the movable comb electrode 3 with respect to the fixed comb electrode 2 due to vibration from the outside.

At least the fixed comb electrode 2 and the movable comb electrode portion 3 are manufactured as MEMS structures having silicon as a base material, for example, although the vibration-driven energy harvester 100 is manufactured by any of a variety of manufacturing methods as will be described later. Therefore, the vibration-driven energy harvester 100 can be referred to as a MEMS vibration element.

By way of example, the vibration-driven energy harvester 100 according to this embodiment utilizes, as electric power, electric charges generated by relative displacement of the movable comb electrode 3 with respect to the fixed comb electrode 2. However, the vibration-driven energy harvester 100 according to this embodiment may be any vibration-driven energy harvester having a structure generating electric charges by relative displacement of the movable electrode with respect to the fixed electrode. A vibration-driven energy harvester utilizing parallel plate electrodes having their surface facing each other may also be employed as a variation of this embodiment.

The vibration-driven energy harvester 100 will be described in detail later.

Hereinafter, a MEMS vibration element, that is, the vibration-driven energy harvester 100 including the base unit 1, the fixed comb electrode 2, the movable comb electrode 3, and the elastic support unit 4 will be described in detail with reference to the drawings. Note that the fixed comb electrode 2 will be referred to as a fixed unit and the movable comb electrode 3 will be referred to as a movable unit in the following since the MEMS vibration element is not limited to a power generation element.

The fixed unit 2 and the movable unit 3 constitute a comb structure in which the units have a plurality of comb-like protrusions as one example and the units are arranged so that protrusions of one unit and protrusions of the other unit mesh with each other via gaps. The fixed unit 2 and the movable unit 3 can be made of crystalline silicon having a high etching processability, as one example. Details of a method of forming the units will be described later.

The elastic support unit 4 is a flexible rectangular flat plate. It is here assumed that directions of long sides of the elastic support unit 4 coincide with the x direction in the figures and directions of short sides coincide with the y direction in the figures. One end in the x direction of the elastic support unit 4 is connected to the movable unit 3 and the other end in the x direction of the elastic support unit 4 is connected to the base unit 1. In other words, the x direction in the figures also coincides with a direction connecting the movable unit 3 and the base unit 1.

The fixed unit 2 is connected and fixed to the base unit 1. Bending and deformation of the flexible elastic support unit 4 allows the movable unit 3 to move with respective to the fixed unit 2, generally in the z direction in the figures.

A resonance frequency f [Hz] of a resonator formed by the movable unit 3 and the elastic support unit 4 is expressed by the following equation (1) as a function of a spring constant k of the elastic support unit 4 and a mass m [kg] of the movable unit 3. The spring constant k is expressed by the following equation (2), where a thickness of the elastic support unit 4 in the z direction is t [m], a distance from a fulcrum to a load point (i.e., a length in the x direction from the base unit 1 to the movable unit 3 along the elastic support unit 4) is L [m], a width dimension (i.e., a width dimension in the y direction of the elastic support unit 4) is b [m], and a Young's modulus is E [Pa].

$$f = (1/2\pi)\sqrt{(k/m)} \quad (1)$$

$$k = (Eb/4L^3)t^3 \quad (2)$$

Thus, determining the width b, the thickness t, and the Young's modulus (rigidity) E of the elastic support unit 4 based on the equations (1) and (2) allows the resonance frequency f to match with a predominant frequency in a desired environment.

For a mass of the movable unit 3 insufficient to use as the mass m in the expression (1), a weight for adjusting the mass can be added to the movable unit 3 to obtain a desired resonance frequency.

As described above, the shapes of the fixed unit 2 and the movable unit 3 are not limited to the above-described comb structures. For example, the units may constitute a parallel plate type configuration in which both units have rectangular parallelepiped shapes and one surface of one unit faces one surface of the other unit.

Additionally, the material of the fixed unit 2 and the movable unit 3 is not limited to silicon, but may be other semiconductors, dielectrics, or metal materials.

However, silicon is a crystalline material and has an advantage that it can be easily etched along a predetermined plane orientation of a crystal.

Figure 2A:
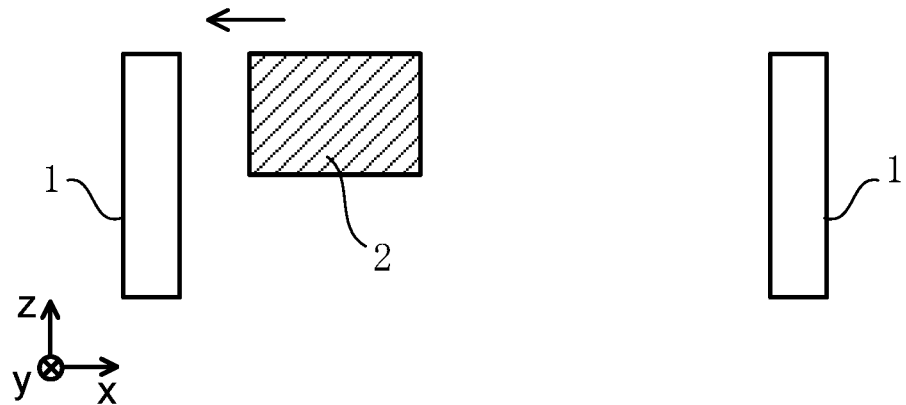
FIGS. 2A to 2C are side cross sectional views showing an example of a process of manufacturing a MEMS vibration element.
Figure 2B:
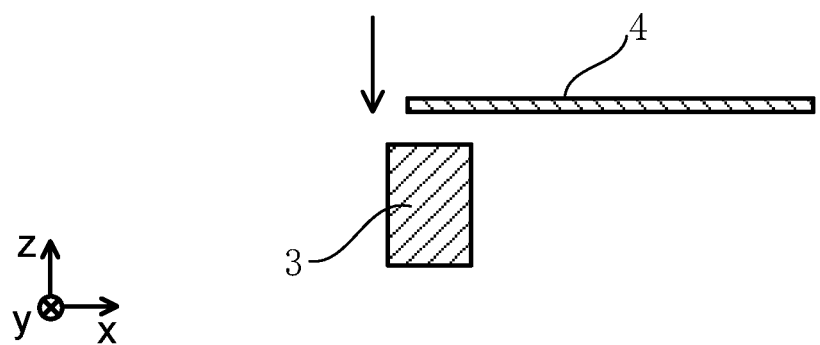
Figure 2C:
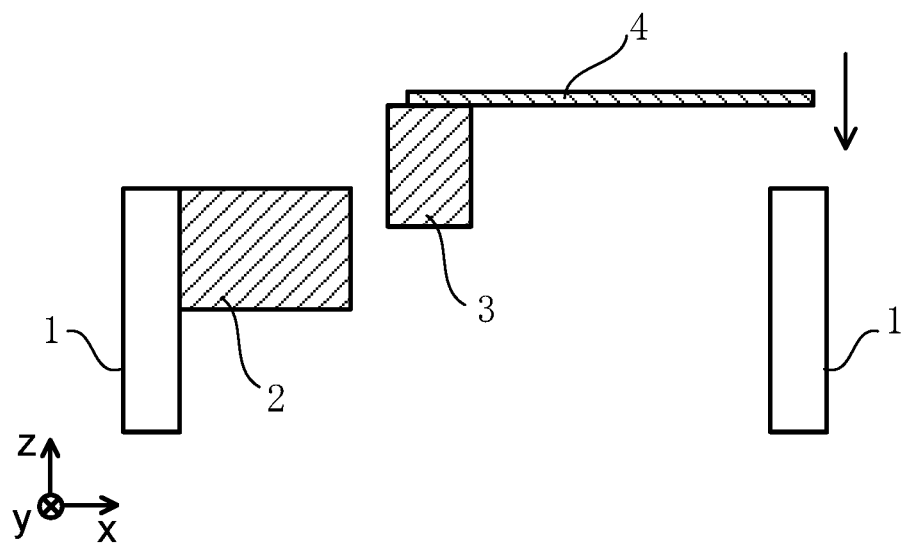

A method for manufacturing the MEMS vibration element according to this example will be described with reference to FIG. 2. FIG. 2(*a*) to FIG. 2(*c*) are views showing profiles of the components in a cross section taken along line B-B of the finished MEMS vibration element shown in FIG. 1(*a*).

Forming Base Unit

The base unit 1, which is a rectangular frame member, is formed by milling, pressing, sintering, photofabrication, or the like. The material of the base unit 1 may be ceramic or metal, or may be a crystal material.

Forming Fixed Unit and Movable Unit

The fixed unit 2 and the movable unit 3 are formed by photolithography, for example. Details of a method of forming the fixed unit 2 and the movable unit 3 will be described later.

Fixing Fixed Unit to Base Unit

As indicated by an arrow in FIG. 2(*a*), the fixed unit 2 is connected to an inner side surface of the base unit 1 at a predetermined position by adhesion, fusion, screwing, or the like.

Forming Elastic Support Unit

The elastic support unit 4, which is a flat plate member having a predetermined thickness, is formed by milling, pressing, photofabrication, or the like. Here, the material, particularly the rigidity (Young's modulus), the thickness, and the width of the elastic support unit 4 are determined based on the equations (1) and (2) so that the resonance frequency f of a resonator consisting of the elastic support unit 4 and the fixed unit 2 matches with a predominant frequency in a desired environment.

Forming Elastic Support Unit

As indicated by an arrow in FIG. 2(*b*), the movable support 3 is connected to one end of the elastic support unit 4 by adhesion, fusion, screwing, or the like. Further, as shown in FIG. 2(*c*), the other end of the elastic support unit 4, which has the movable unit 3 connected at one end thereof, is connected to an upper surface of the base unit 1 at a predetermined position by adhesion, fusion, screwing, or the like.

In this way, the MEMS vibration element according to this example can be manufactured. Thus, the method of manufacturing the MEMS vibration element according to this example includes a step of forming the base unit, a step of forming the fixed unit and the movable unit, a step of forming the elastic support unit, and a step of connecting the movable unit to the elastic support unit.

The order of the steps in the manufacturing process is not limited to the above-described order. Thus, the order of forming and connecting the members may be different from the above-described order. The connection in the manufacturing process may be semi-permanent fixation with an adhesive or the like, or may be separable fixation by screwing or the like.

According to the MEMS vibration element and the method of manufacturing the MEMS vibration element of this embodiment described above, the following operational effects can be achieved.

(1) A MEMS vibration element 100 includes: a fixed unit 2 that is fixed to a base unit 1; a movable unit 3 that is movable with respect to the fixed unit 2; and an elastic support unit 4 that elastically supports the movable unit 3 at the base unit 1, wherein the elastic support unit 4 is made of a material different from that of the fixed unit 2 and the movable unit 3. Therefore, as an operational effect, flexibility in design and selection of the elastic support unit 4 is improved and the MEMS vibration element 100 having a resonance frequency that matches with a predominant frequency in a desired environment can be easily realized.

(2) A method of manufacturing a MEMS vibration element includes: forming a base unit 1; forming a fixed unit 2; forming a movable unit 3; forming an elastic support unit 4 from a material that is different from that of the fixed unit 2 and the movable unit 3; connecting one end of the elastic support unit 4 to the base unit 1; and connecting the other end of the elastic support unit 4 to the movable unit 3. According to the method of manufacturing the MEMS vibration element of this embodiment, as an operational effect, flexibility in design and selection of the elastic support unit 4 is improved and a MEMS vibration element having a resonance frequency that matches with a predominant frequency in a desired environment can be easily achieved, since the elastic support unit 4 is made of a material different from that of the fixed unit 2 and the movable unit 3.

Additionally, a material having a higher durability against damage due to impact or vibration than a durability of the material constituting the fixed unit 2 and the movable unit 3 may be selected as a material of the elastic support unit 4. One indicator of the durability against impact is a fracture toughness value measured by a Kic test (ASTME399-90). That is, the elastic support unit 4 desirably has a fracture toughness value higher than the material constituting the fixed unit 2 and the movable unit 3.

Note that the elastic support unit 4 is preferably made of a metal such as an aluminum alloy, a titanium alloy, or a stainless steel because metal materials generally have fracture toughness values higher than those of semiconductor materials such as silicon.

Additionally, the elastic support unit 4 is preferably made of a material having a fracture toughness value of 10 [MPa·m$^{1/2}$] or higher.

Forming the elastic support unit 4 from a material having a high fracture toughness value can provide a MEMS vibration element having a higher durability against impact and vibration, as an operational effect.

Specific Method of Forming Fixed Unit and Movable Unit

An example of a method of forming the fixed unit 2 and the movable unit 3 is described in detail with reference to FIG. 3. In this example, the fixed unit 2 and the movable unit 3 are made of a single crystal silicon wafer 10 by photolithography.

FIG. 3(*a*) is a top view of the silicon wafer 10, and FIGS. 3(*b*), 3(*c*), and 3(*d*) are cross-sectional views taken along line D-D of FIG. 3(*a*).

Ultraviolet Irradiation to Fixed Unit Formation Region and Movable Unit Formation Region A photoresist 11 is applied on a surface of the silicon wafer 10, and ultraviolet rays 122, 123 are irradiated only onto the photoresist 11 in regions 2*a*, 3*a* indicated by hatching in FIGS. 3(*a*), 3(*b*), that is, regions 2*a*, 3*a* on an upper surface of the silicon wafer 10 in which the fixed unit 2 and the movable unit 3 are to be formed.

Development

Figure 3A:
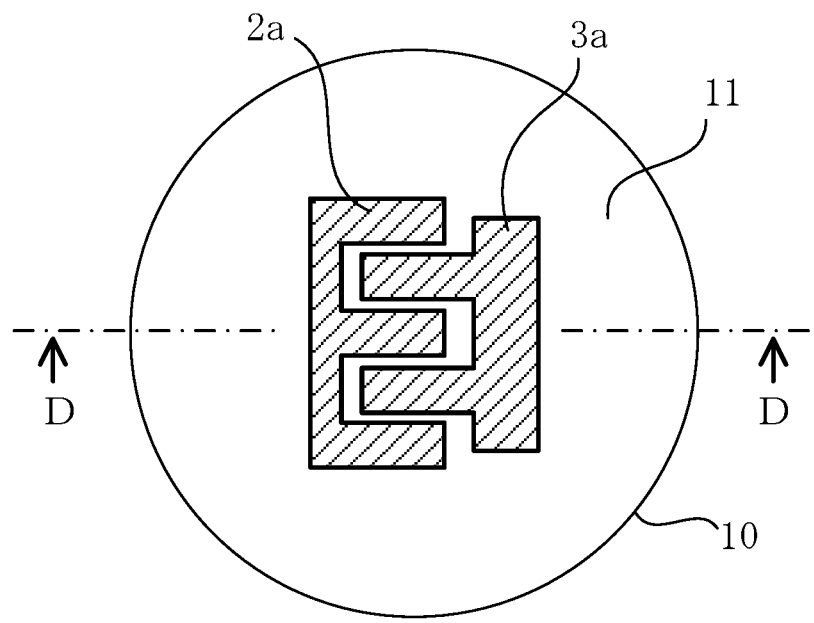
FIGS. 3A to 3D are views showing an example of a process of forming the fixed unit and the movable unit.
Figure 3B:
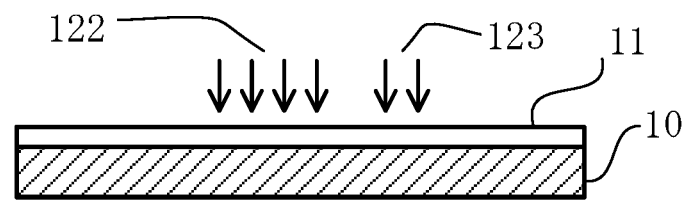
Figure 3C:
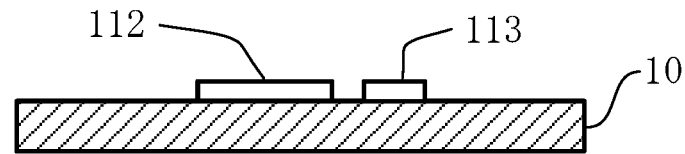

The photoresist 11 is developed so that the photoresist remains only in the regions 2a, 3a irradiated with the ultraviolet rays 122, 123 as shown in FIG. 3(c). Accordingly, shapes of the fixed unit 2 and the movable unit 3 to be formed are transferred onto the silicon wafer 10 as shapes of the photoresists 112, 113.

Forming Fixed Unit and Movable Unit by Etching

Figure 3D:

The silicon wafer 10 is etched by dry etching using a fluorine-containing gas, with the photoresists 112, 113 as etching masks. Then, any photoresist remaining after completion of the etching is removed to form the fixed unit 2 and the movable unit 3 as shown in FIG. 3(d).

Note that a negative-tone photoresist for curing portions exposed to ultraviolet rays is used in this example; however, a positive-tone photoresist for dissolving portions exposed to ultraviolet rays may also be used by reversing regions to be irradiated with ultraviolet rays.

In FIG. 3, the sizes of the fixed unit 2 and the movable unit 3 and the regions 2a and 3a in which the fixed unit 2 and the movable unit 3 are to be formed are exaggerated. However, the actual size is from a fraction to several tenths of the diameter of the silicon wafer 10. Therefore, a large number of fixed units 2 and movable units 3 can be created from a single silicon wafer 10.

According to the method for manufacturing the MEMS vibration element described above, the following operational effects can be achieved.

Conventionally, in forming a MEMS vibration element by lithography, a portion corresponding to the elastic support unit 4 of this example is also formed by lithography. For this reason, the total area of the MEMS vibration element to be formed on the silicon wafer increases, so that the number of MEMS vibration elements created from a single silicon wafer is reduced, resulting in a high manufacturing cost.

In contrast, in this example, only the fixed unit 2 and the movable unit 3 are made of silicon by lithography while the elastic support unit 4 is made of a different material. Thus, a larger number of MEMS vibration elements can be created from a single silicon wafer 10, which leads to a reduced manufacturing cost as an operational effect.

First Variation of MEMS Manufacturing Method

Figure 4:
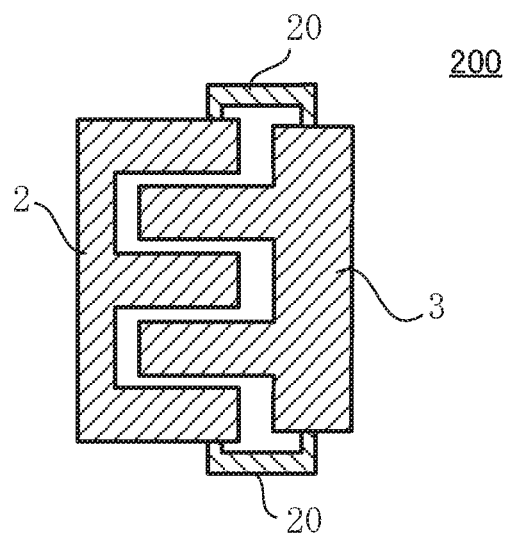
FIG. 4 is a view showing a variation of the process of forming the fixed unit and the movable unit.

A method as shown in FIG. 4 is also applicable for forming the fixed unit 2 and the movable unit 3.

FIG. 4 is a view showing a variation of the method of forming the fixed unit 2 and the movable unit 3. In this variation, the fixed unit 2 and the movable unit 3 are formed in a manner that they are coupled to each other by a coupling portion 20. Specifically, in the photolithography shown in FIG. 3(a), the photoresist 11 in a region where the coupling portion 20 is to be formed (not shown in FIG. 3(a); a region indicated by reference numeral 20 in FIG. 4) is also irradiated with ultraviolet ray, in addition to the regions 2a, 3a where the fixed unit 2 and the movable unit 3 are to be formed. Thereafter, development and etching are performed in the same manner as shown in FIG. 3 to form an integrated unit 200 including the fixed unit 2 and the movable unit 3 coupled by the coupling portion 20 as shown in FIG. 4.

In a case where a MEMS vibration element is manufactured using the integrated unit 200 of this variation, a part of the manufacturing process shown in FIG. 3 is changed.

Fixing Integrated Unit to Base Unit

The fixed unit 2 included in the integrated unit 200 is connected to the inner side surface of the base unit 1 at a predetermined position, and then one end of the elastic support unit 4 is connected to the movable unit 3 included in the integrated unit 200 and the other end of the elastic support unit 4 is connected to the upper surface of the base unit 1 at a predetermined position.

Removing Coupling Portion

After the integrated unit 200 is fixed to the base unit 1, the coupling portion 20 is removed. The removal of the coupling portion 20 is performed, for example, by melting by irradiation of the coupling portion 20 with laser ray, by dissolution of the coupling portion 20 by local wet etching, or by dissolution by wet etching after locally oxidizing the coupling portion 20. Alternatively, the coupling portion 20 may be removed by mechanical cutting. For the removal of the coupling portion 20, it is not necessary to completely remove the coupling portion 20. It is only necessary to remove (cut) at least a part of the coupling part 20 so that the movable unit 3 can move with respect to the fixed unit 2.

The method of manufacturing the MEMS vibration element according to this variation includes: a step of forming the base unit 1; a step of forming the integrated unit 200 including the fixed unit 2 and the movable unit 3 coupled by the coupling portion 20; a step of forming the elastic support unit 4; a step of connecting the integrated unit 200 to the base unit 1; and a step of removing the coupling portion 20.

The method of manufacturing the MEMS vibration element according to this variation achieves the following operational effects.

In this variation, the fixed unit 2, the movable unit 3, and the coupling portion 20 that couples the fixed unit 2 and the movable unit 3 are integrally formed from the same base material. The integrated unit is then connected to the base unit 1 and the elastic support unit 4, before the coupling unit 20 is removed. Therefore, as an operational effect of this variation, the fixed unit 2 and the movable unit 3 can be handled as an integrated part (the integrated unit 200) in the process of manufacturing the MEMS vibration element so that steps of transporting and assembling parts can be simplified.

Note that in each of the above-described embodiments and variations, the fixed unit 2, the movable unit 3, and the coupling portion 20 are created from a silicon wafer. However, the base material for forming the members is not limited to the silicon wafer. For example, the members can be created from a wafer made of another crystalline material such as sapphire.

Additionally, in each of embodiments and variations described above, the elastic support unit 4 has a rectangular flat plate shape. However, the shape of the elastic support unit 4 is not limited thereto. For example, the shape may be a trapezoid as in a variation shown in FIG. 5.

FIG. 5 is a view showing a variation of the shape of the elastic support unit 4.

Figure 5A:
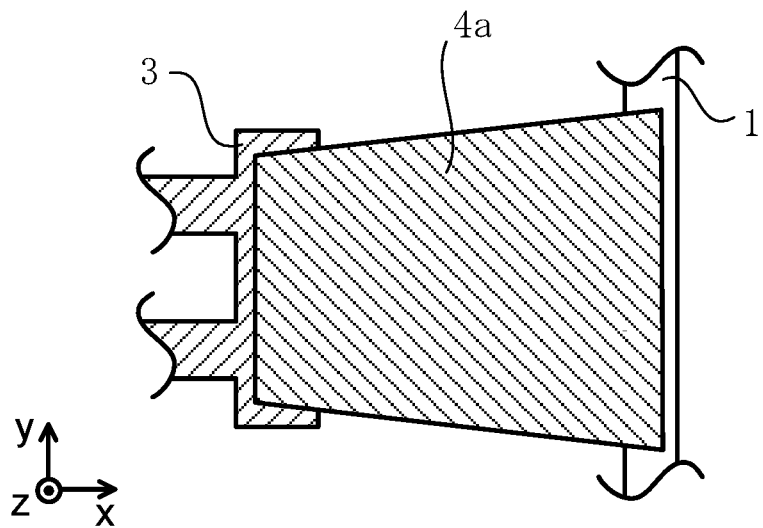
FIGS. 5A and 5B are views showing a variation of the elastic support unit.
Figure 5B:
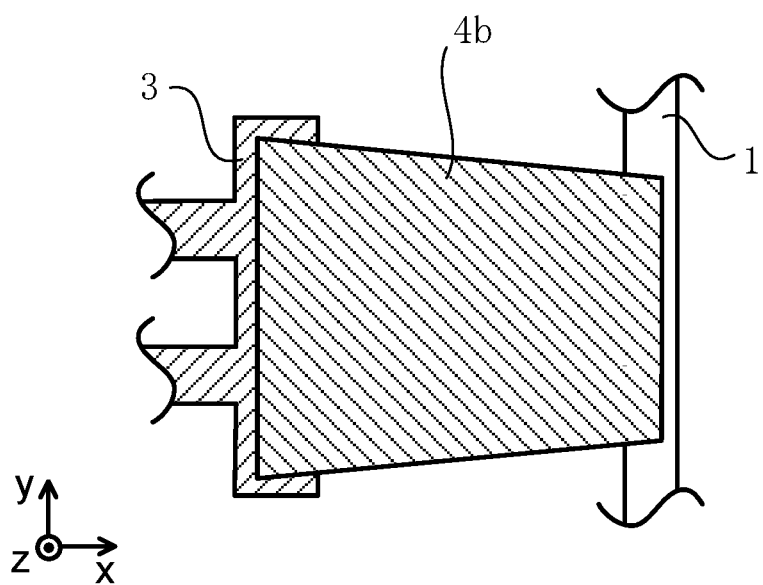

An elastic support unit 4a shown in FIG. 5(a) has a trapezoidal shape in which the width on the movable unit 3 side (a length in the y direction in the figures) is shorter than the width on the base unit 1 side. In contrast, the elastic support unit 4b shown in FIG. 5(b) has a trapezoidal shape in which the width on the movable unit 3 side is longer than the width on the base unit 1 side.

Such a trapezoidal shape of the elastic support unit 4 provides relaxation of stress concentration generated in a portion of the elastic support unit 4 in the vicinity of the base unit 1, when the elastic support unit 4 vibrates with the base unit 1 as a fulcrum.

Note that the effect of stress relaxation can be obtained so long as the width of the elastic support unit 4 in the y direction in the figures (the direction perpendicular to the x direction) at least partially varies depending on the position in the x direction in the figures (the direction connecting to the movable unit 3 and the base unit 1); thus, the shape of the elastic support unit 4 is not limited to the trapezoidal shape in the above-described embodiments. Further, it is desirable that particularly the width of a portion of the elastic support unit 4 in the vicinity of the base unit 1 varies depending on the position in the x direction.

As an operational effect of such a variation, varying the width of the elastic support unit 4 in the y direction depending on the position in the x direction can provide relaxation of stress generated when the elastic support unit 4 vibrates, which can lead to improvement in durability of the elastic support unit 4 and the MEMS vibration element.

Note that the vibration direction of the elastic support unit 4 and the movable unit 3 is the z direction in FIG. 1 in the above-described embodiment; however, the vibration direction is not limited thereto.

For example, the elastic support unit 4 may be a flat plate parallel to the xz plane in FIG. 1, and the elastic support unit 4 and the movable unit 3 may vibrate in the y direction in FIG. 1.

In this case, a groove may be provided in the inner side surface of the base unit 1, and an end of the elastic support unit 4 may be inserted and fixed into the groove. Alternatively, a portion of the end of the elastic support unit 4 may be bent at an angle of 90 degrees, and the bent portion may be connected to the inner side surface of the base unit 1 by adhesion or the like.

In a case where the fixed unit 2 and the movable unit 3 constitute a comb structure, in the configuration in which the elastic support unit 4 vibrates in the y direction in FIG. 1, the fixed unit 2 and the movable unit 3 are correspondingly arranged, that is, rotated at an angle of 90 degrees, with a rotation axis in the x direction in FIG. 1.

Vibration-Driven Energy Harvester

An example in which the MEMS vibration element described above is applied to the vibration-driven energy harvester 100 will be described with reference to FIG. 1.

In order to apply the MEMS vibration element to the vibration-driven energy harvester 100, a fixed electrode is formed on a surface of the fixed unit 2 facing the movable unit 3, a movable electrode is formed on a surface of the movable unit 3 facing the fixed unit 2, and an electret is formed on at least one of the fixed electrode and the movable electrode.

In a case where the fixed unit 2 and the movable unit 3 are made of a dielectric or a semiconductor having a low conductivity, a film of a conductive material such as metal, polycrystalline silicon, or amorphous silicon is formed on surfaces of both units facing each other to form a fixed electrode and a movable electrode.

On the other hand, in a case where the fixed unit 2 and the movable unit 3 are made of a metal or a semiconductor having a high conductivity, the fixed unit 2 and the movable unit 3 themselves function as a fixed electrode and a movable electrode. It is thus not necessary to separately provide a conductive material. The fixed unit and the movable unit having silicon as a base material, as in the embodiment, are themselves the fixed electrode 2 and the movable electrode 3. Further, in a case where the fixed unit and the movable unit constitute a comb structure as in the embodiment, the fixed unit and the movable unit are the fixed comb electrode 2 and the movable comb electrode 3, respectively.

The electret is formed by subjecting at least one of the fixed electrode on the fixed unit 2 and the movable electrode on the movable unit 3 to a known charging process (e.g., a charging process described in Japanese Laid-Open Patent Publication No. 2014-049557).

Note that in a case where the surface of the fixed electrode or the movable electrode is not silicon, a film of polycrystalline silicon or amorphous silicon is formed on the surface before the charging process.

By electretization, at least one of the fixed electrode on the fixed unit 2 and the movable electrode on the movable unit 3 is charged semi-permanently. As a result, in an electrode (the other of the fixed electrode and the movable electrode) facing the electretized electrode, an induced charge having a property opposite to that of the electretized electrode is induced.

When vibration is applied to the vibration-driven energy harvester 100 from the outside, the elastic support unit 4 bends and the movable unit 3 vibrates in the z direction. This results in a change in an area where the fixed electrode on the fixed unit 2 and the movable electrode on the movable unit 3 face each other. Accordingly, the induced charge due to the electret also changes so that a potential difference between the fixed electrode and the movable electrode changes to generate an electromotive force. This allows the vibration-driven energy harvester 100 to generate electric power.

As shown in FIG. 1, the fixed unit 2 is provided with a pad 5a electrically connected to a fixed electrode (not shown). The pad 5a is electrically connected to an electrode 6a provided on the base unit 1 by a lead 7a. The movable unit 3 is provided with a pad 5b electrically connected to a movable electrode (not shown). The pad 5b is electrically connected to an electrode 6b provided on the base unit 1 by a lead 7b.

Therefore, a potential difference generated between the fixed electrode on the fixed unit 2 and the movable electrode on the movable unit 3 is transmitted to the electrode 6a and the electrode 6b provided on the base unit 1, so that electric power can be extracted from the electrode 6a and the electrode 6b to the outside.

Note that the electrode 6a and the electrode 6b are desirably electrically insulated in order to efficiently extract electric power to the outside. For this purpose, it is desirable that the base unit 1 is made of an insulating material or an insulating material is provided between the base unit 1 and the electrodes 6a and 6b.

Additionally, the lead 7b uses a thin wire made of gold, silver, aluminum, or an alloy thereof in order to allow vibration of the movable unit 3 and the elastic support unit 4 as much as possible and to provide high conductivity and durability.

Note that in a case where the elastic support unit 4 is made of a conductive material such as metal, the pad 5b may be provided on the elastic support unit 4, instead of the movable unit 3 as described above, provided that the movable unit 3 and the elastic support unit 4 are connected in an electrically conductive manner. In particular, providing the pad 5b in a portion of the elastic support unit 4 in the vicinity of the base unit 1 reduces a movement amount of the pad 5b during vibration of the elastic support unit 4 and thus also reduces a deformation amount of the lead 7b, which results in an improvement in durability of the lead 7b.

Note that the use of the MEMS vibration element of this example is not limited to the vibration-driven energy harvester using the above-described electret; the MEMS vibration element may be applied to other types of vibration-driven energy harvesters.

For example, a permanent magnet may be installed in one of the fixed unit and the movable unit of the MEMS vibration element of this example and a coil made of a thin metal wire may be formed on the other unit by circuit printing technology or the like to constitute an electromagnetic vibration-driven energy harvester.

Additionally, the use of the MEMS vibration element of this example is not limited to the vibration-driven energy harvester; the MEMS vibration element may be applied to a wide range of uses such as acceleration sensors and microphones.

Although various embodiments and variations have been described above, the present invention is not limited thereto. Further, the embodiments and variations may be applied alone or in combination. Other embodiments conceivable within the scope of the technical idea of the present invention are also included in the scope of the present invention.

The disclosure of the following priority application is herein incorporated by reference:

Japanese Patent Application No. 2017-154475 (filed Aug. 9, 2017)

REFERENCE SIGNS LIST

100 . . . vibration-driven energy harvester, 1 . . . base unit, 2 . . . fixed unit, 3 . . . movable unit, 4 . . . elastic support unit, 20 . . . coupling unit, 10 . . . silicon wafer

The invention claimed is:

1. A MEMS vibration element, comprising:
a base unit;
a fixed unit fixed to the base unit;
a movable unit that is movable relative to the fixed unit; and
an elastic support unit that elastically supports the movable unit at the base unit, wherein:
the elastic support unit is made of a material different from a material of the fixed unit and the movable unit.

2. The MEMS vibration element according to claim 1, wherein:
the elastic support unit is made of a material having a fracture toughness value higher than a fracture toughness value of the material constituting the fixed unit and the movable unit.

3. The MEMS vibration element according to claim 1, wherein:
the elastic support unit is made of metal.

4. The MEMS vibration element according to claim 1, wherein:
the elastic support unit is made of a material having a fracture toughness value of 10 [MPa·m1/2] or higher.

5. The MEMS vibration element according to claim 1, wherein:
the fixed unit and the movable unit are made of silicon.

6. The MEMS vibration element according to claim 1, wherein:
the fixed unit and the movable unit constitute a comb structure.

7. The MEMS vibration element according to claim 1, wherein:
the elastic support unit is made of a flat plate, and a width in a direction orthogonal to a predetermined direction connecting the movable unit and the base unit at least partially varies depending on a position in the predetermined direction.

8. A vibration-driven energy harvester, comprising:
the MEMS vibration element according to claim 1, wherein:
the fixed unit comprises a fixed electrode;
the movable unit comprises a movable electrode; and
at least one of the fixed electrode and the movable electrode has an electret on a surface thereof.

9. A method of a MEMS vibration element, comprising:
forming a base unit;
forming a fixed unit;
forming a movable unit;
forming an elastic support unit of a material different from a material of the fixed unit and the movable unit;
connecting one end of the elastic support unit to the base unit; and
connecting the other end of the elastic support unit to the movable unit.

10. The method of manufacturing the MEMS vibration element according to claim 9, wherein:
the elastic support unit is made of a material having a fracture toughness value higher than a fracture toughness of the material of the fixed unit and the movable unit.

11. The method of manufacturing the MEMS vibration element according to claim 9, wherein:
the fixed unit and the movable unit are formed by photolithography.

12. The method of manufacturing the MEMS vibration element according to claim 11, wherein:
in the photolithography, the fixed unit, the movable unit, and a coupling portion for coupling the fixed unit and the movable unit are made of a same base material; and
after one end of the elastic support unit is connected to the base unit and the other end of the elastic support unit is connected to the movable unit, the coupling portion is removed to separate the fixed unit and the movable unit.

* * * * *